United States Patent
Müller

(10) Patent No.: US 6,452,086 B1
(45) Date of Patent: Sep. 17, 2002

(54) SOLAR CELL COMPRISING A BYPASS DIODE

(75) Inventor: Rainer Müller, Nürnberg (DE)

(73) Assignee: Astrium GmbH, Munich (DE)

(*) Notice: Subject to any disclaimer, the term of this patent is extended or adjusted under 35 U.S.C. 154(b) by 0 days.

(21) Appl. No.: 09/787,857

(22) PCT Filed: Sep. 28, 1999

(86) PCT No.: PCT/DE99/03103

§ 371 (c)(1),
(2), (4) Date: Mar. 22, 2001

(87) PCT Pub. No.: WO00/21138

PCT Pub. Date: Apr. 13, 2000

(30) Foreign Application Priority Data

Oct. 5, 1998 (DE) .......................... 198 45 658

(51) Int. Cl.⁷ .................. H01L 31/18; H01L 27/142
(52) U.S. Cl. .................. 136/244; 136/249; 136/255; 136/261; 257/461; 257/465; 257/431; 438/98; 438/57; 438/59; 438/78
(58) Field of Search ................ 136/244, 249, 136/255, 261; 257/461, 465, 431; 438/98, 57, 59, 78

(56) References Cited

U.S. PATENT DOCUMENTS 4,533,933 A * 8/1985 Pellegrini et al. .......... 257/455
4,846,896 A   7/1989 Hokuyo .................. 136/255
5,609,694 A * 3/1997 Asai ...................... 136/255
5,616,185 A   4/1997 Kukulka .................. 136/244

FOREIGN PATENT DOCUMENTS

| DE | 3903837 | 8/1989 |
| DE | 4136827 | 5/1992 |
| EP | 0369666 | 5/1990 |
| EP | 0768720 | 4/1997 |
| EP | 768720 A2 * | 4/1997 |

OTHER PUBLICATIONS

Patent Abstracts of Japan Publication No. 03024768 dated Jan. 2, 1991.

Patent Abstracts of Japan Publication No. 61067968 dated Aug. 4, 1986.

\* cited by examiner

Primary Examiner—Alan Diamond
(74) Attorney, Agent, or Firm—Ladas & Parry

(57) ABSTRACT

The invention relates to a production method for a solar cell and to the solar cell itself which comprises an integrated bypass diode on the side facing away from the incidence of light and which can be produced in a simple manner by diffusion. A one-piece electric conductor serves to connect two successive solar cells in series and simultaneously effects the contacting of the corresponding bypass diode.

9 Claims, 2 Drawing Sheets

SOLAR CELL COMPRISING A BYPASS DIODE

FIELD OF THE INVENTION

The invention concerns a method to manufacture a solar cell in which at least one layer of a semiconductor of a second doping type is applied to a base layer of a semiconductor of a first doping type to create the solar cell, and in which a bypass diode is formed by diffusing additional suitable doping types into an unmasked site of the solar cell.

BACKGROUND

The basic problem is that series-connected solar cells require bypass diodes that suppress an arising impermissibly high reverse voltage when one or more cells are shaded.

DE 39 03 837 A1 discloses a solar cell that is built on an n-type GaAs layer. The bypass diode necessary to protect individual shaded cells when several equivalent solar cells are series-connected is located to the side of the solar cell. With this, the solar cell itself is no shaded, but the cell requires more area. This is especially problematic for aerospace application. In addition, the solar cell and bypass diode negativity affect each other in the manufacturing process.

DE 41 36 827 C2 describes two different types of solar cells. In the first type, the bypass diode is implanted on the side of the solar cell facing the incident light and accordingly shades a part of the useful surface. The second type of portrayed solar cells is characterized in that the solar cell is formed on one surface of a p-type silicon substrate, and a by-pass diode is formed on the other surface. However due to the polarity of the bypass diode, it only can be used to protect the next solar cell in the series circuit. Hence another discrete diode is required to protect the first solar cell of a series circuit. In addition, such an arrangement requires that the electrical connection between the two neighboring solar cells be made via two different electrical conductors.

EP 0 768 720 discloses the etching of a recess in the rear of the substrate of a solar cell in which, after metallizing the entire rear of the substrate and then applying a silicon adhesive, a wafer piece can be inserted that forms a diode and can be wired as a bypass diode. In this case, the solar cell and diode to not form a unit made of the same material; the solar cell and diode are only joined. The diode has to be connected to the solar cell by means of electrodes that are connected to the rear metallization of the respective or neighboring solar cell. Poorly defined conductive connections can be created between the solar cell and diode, and the interfaces between the different materials also yield additional problems.

SUMMARY OF THE INVENTION

The invention is therefore based on the problem of presenting a solar cell with an integrated bypass diode in which the diode does not shade or reduce the photoelectric surface and that is easy to manufacture, and whereby the processes for manufacturing the solar cell and diode influence each other as little as possible. In addition, the design of the electrical connections between the neighboring solar cells and between the solar cell and diode should be as simple as possible and with no interference.

The particular advantages of the solar cell according to the invention are that the two components, the solar cell and integrated bypass diode, are manufactured almost independently, and the two processes do not negatively influence each other. The effort for creating the bypass diode is very small. The photoelectric surface of the solar cell is not reduced by the bypass diode. Finally, the cell design has the advantage that a single-piece electrical conductor which is very easy to manufacture can be used as the electrical cell connector.

The invention can basically be used with a wide range of semiconductor substrates, for example: n-Si, p-Si, n-Ge, p-Ge, n-GaAs, p-GaAs, etc. The exemplary embodiment is restricted to representing the principle using an n-type Ge substrate.

DESCRIPTION OF THE FIGURES OF THE DRAWING

An exemplary embodiment of the invention is illustrated in the drawing, wherein.

DETAILED DESCRIPTION

Figure 1:
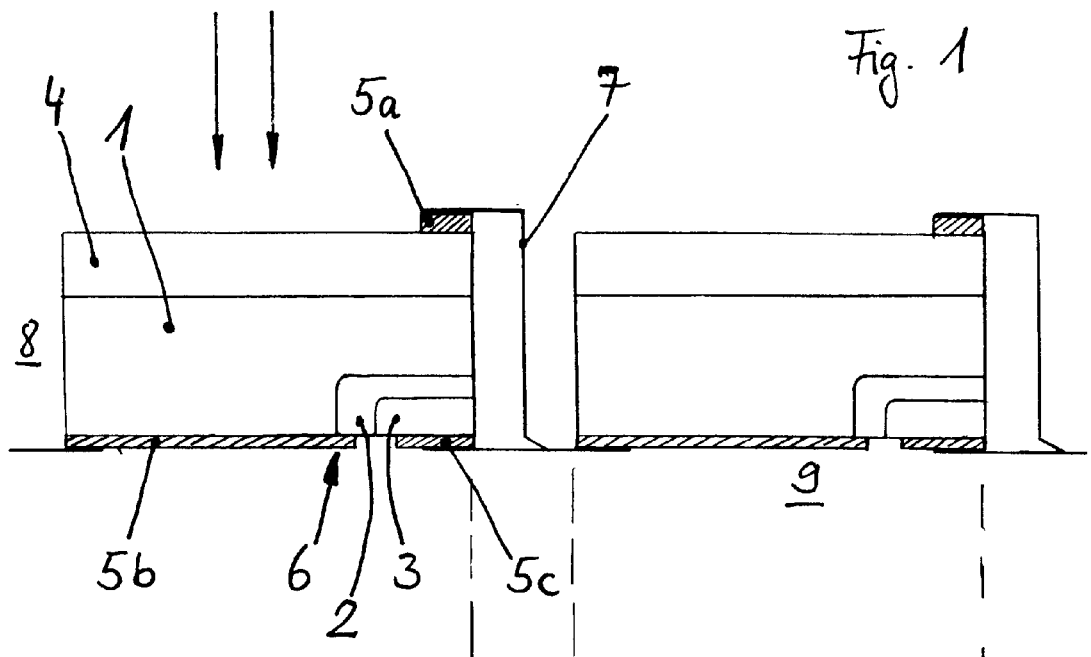
FIG. 1 is a sectional view of solar cells according to the invention.

FIG. 1 shows a schematic representation of the construction of a solar cell as an exemplary embodiment of the invention. The solar cell 8 has a n-type Ge substrate as the starting material. On the side of the substrate opposite the incident light, a well 2 is introduced by means of p-diffusion in a first process step to form a monolithic body. The well is locally limited in a manner known per se using a suitable masking medium (such as silicon nitride) that leaves free the site of the substrate to be doped and that is removed after doping. The well 2 later forms the anode of the bypass diode. Then using another mask, a n-doped island 3 is diffused as a monolithic body in the p-doped well 2, and again a masking layer is applied before diffusion. The n-doped island 3 acts as the cathode of the bypass diode. Only after the bypass diode arises, the epitaxy layers of one or more solar cell arrangements 4 are created on the other side of the substrate 1 using conventional epitaxy procedures. These procedures are prior art and are therefore not further described. Before deposition, the front of the semiconductor material is correspondingly prepared (polished, etc.). Using the described procedural steps, the solar cell 8 is formed with a bypass diode 2, 3 integrated on the rear. An advantageous side effect is that the creation of the bypass diode and the application of the epitaxy layers are not mutually problematic. The diffusion processes to manufacture the bypass diode are set up such that the dopant depths or profiles only reach the desired values and shapes after all the high temperature steps are over.

Figure 2:
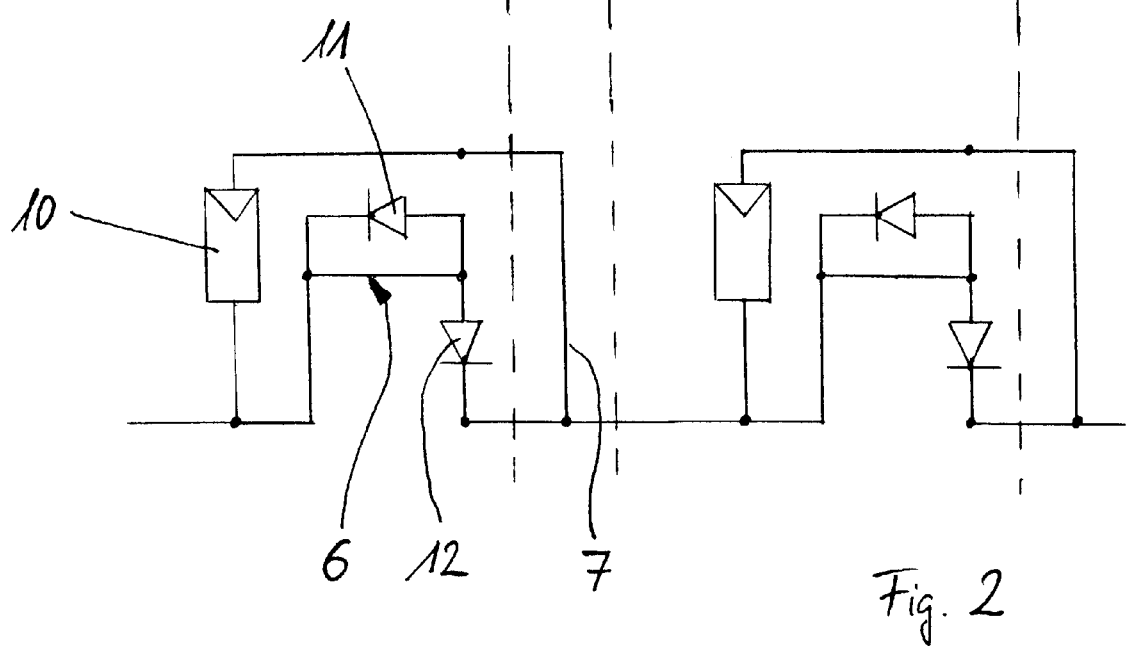
FIG. 2 is an equivalent circuit diagram of the solar cells in FIG. 1.

In another procedural step, the electrical connections are created by metallizing specific areas of the front and rear of the solar cell 8. On the side facing the incident light, a comb-shaped electrode 5a on the front is sufficient that serves to contact the emitter of the solar cell 8. Two additional electrical contact surfaces 5b, 5c are applied on the side of the solar cell 8 opposite the incident light. The first additional contact 5b serves to provide an electrical connection to the base contact of the solar cell 8. It also fulfills another task. As can be seen in the equivalent circuit diagram in FIG. 2, when the solar cell 8 is being created, the photoelectric solar cell 10 is created along with two other diametrically opposed, series-connected diodes 11, 12 by p-doping and n-doping the side opposite the incident light. Of these two diodes, only the one that is polarized opposite the solar cell 10 is needed as the bypass diode 12. The first additional contact 5b is therefore designed so that it bridges as a short-circuit 6 the pn transition of the parasitic diode 11 in the equivalent circuit diagram in FIG. 2 that is formed from the n-type Ge substrate and the p-type well 2.

Figure 3:
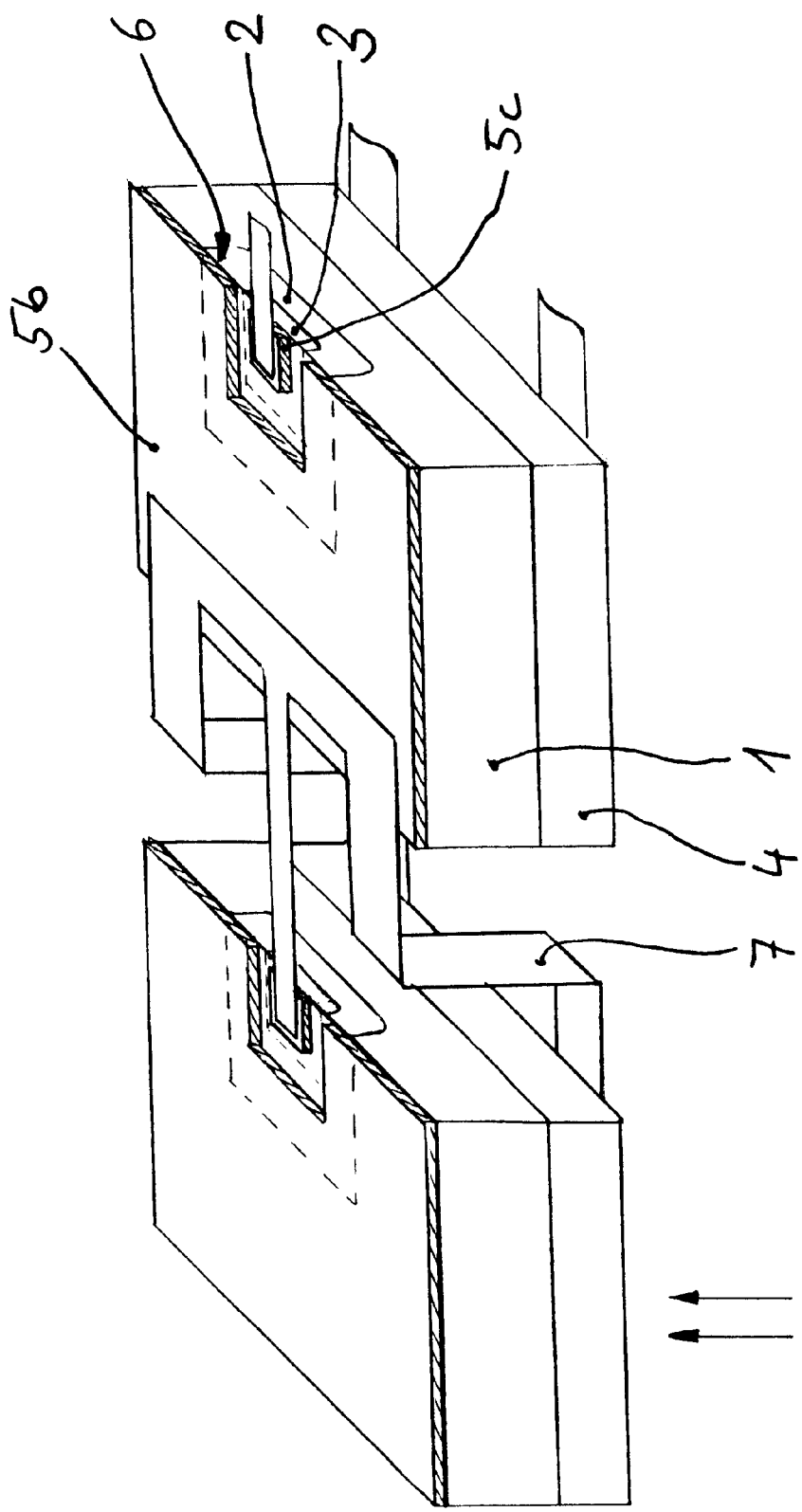
FIG. 3 is a perspective view of a series circuit of two solar cells.

The electrical conductor 7 has a combined function. On the one hand, it connects in series the solar cells 8 and 9 by connecting the front contact of the solar cell 8 to the base contact of the solar cell 9. On the other hand, it creates the electrical connection of the cathode 5c of the bypass diode 12 with the front electrode 5a and hence the emitter of the solar cell 8. The simple design of this electrical conductor 7 shown in an angled view in FIG. 3 is particularly advantageous. The conductor 7 only consists of a stamped, etched or eroded part of a conductive film or thin metal sheet that is shaped as needed with a suitable tool. It is also very easy to place two or more bypass diodes on one solar cell using the method according to the invention. In this case, a correspondingly adapted shape is used for the conductor 7.

The described integration of a bypass diode is particularly suitable for modern solar cell technology for manufacturing tandem or triple solar cells on GaAs or Ge substrates that are used to produce highly efficient solar cells for aerospace travel. The cited technologies will especially profit from the described procedure since the bypass diodes are integrated in the substrate material before the procedural steps to manufacture the photoelectric solar cell layers. The blocking and transmitting behavior of the bypass diode can therefore be optimized independent of the actual solar cell. The highest-possible breakdown voltage and a low forward voltage are sought that drive shaded solar cells in reverse direction.

What is claimed is:

1. A solar cell comprising a cell unit which comprises a substrate of a semi-conductor material of a first doping type having front and back surfaces, a solar cell element, arranged in epitaxy layers, on the front surface of the substrate for exposure to incident light, a bypass diode integrated in said substrate at the back surface of the substrate, said bypass diode comprising a well of semiconductor material of a second doping type diffused as a monolithic body in said substrate at said back surface thereof, and an island of the semiconductor material of said first doping type diffused in said well as another monolithic body, and electrical connector means connecting said substrate, said solar cell element and said bypass diode.

2. The solar cell of claim 1, wherein said electrical connector means comprises a metal front contact on a surface of said solar cell unit which faces the incident light, and two further contacts, one of which connects the substrate and the well and the other of which forms an external connection of the bypass diode.

3. The solar cell of claim 2, wherein said one of said two further contacts covers the back surface of the substrate.

4. The solar cell of claim 2, wherein said other of the further contacts is connected to said well.

5. The solar cell of claim 1, further comprising a second said cell unit connected in series with the first said cell unit.

6. The solar cell of claim 5, further comprising a one-piece electrical conductor connecting the first and second cell units in series and also connecting a cathode of said bypass diode and said first contact of the first cell unit.

7. A method of producing a solar cell comprising:

forming a substrate of a semiconductor material of a first doping type, the substrate having front and back surfaces, forming a well in the substrate at the back surface of the substrate by diffusing a semiconductor material of a second doping type in said substrate as a monolithic diffusion body therein, forming an island in said well by diffusing a doping material of said first doping type in said well as a second monolithic diffusion body thereby to form a bypass diode for the solar cell in which said well forms the anode of the bypass diode and the island forms the cathode of the bypass diode, said well and said island which are formed by diffusion, being integrated with said substrate as said monolithic diffusion bodies therein;

forming a solar cell arrangement in epitaxy layers on the front surface of the substrate for exposure to incident light, and electrically connecting the solar cell arrangement, the substrate and the bypass diode together.

8. The method of claim 7, comprising connecting a second solar cell in series with the first said solar cell by a one piece electrical conductor which also serves to electrically connect the cathode of the bypass diode and the epitaxy layers of the solar cell arrangement.

9. The method of claim 7, wherein said solar cell arrangement, said substrate and said bypass diode are electrically connected by metalllized contacts formed on said solar cell arrangement and on said back surface of said substrate.

* * * * *